United States Patent [19]
Wicker
[11] Patent Number: 4,684,593
[45] Date of Patent: Aug. 4, 1987

[54] SECURE AND SELF-VERIFIABLE IMAGE

[75] Inventor: Ralph C. Wicker, Rochester, N.Y.
[73] Assignee: Secure Images Inc., Rochester, N.Y.

[21] Appl. No.: 859,146
[22] Filed: May 2, 1986

Related U.S. Application Data

[62] Division of Ser. No. 608,116, May 8, 1984, Pat. No. 4,632,430.

[51] Int. Cl.[4] ........ B42D 15/00; G03F 5/00; G03F 9/00
[52] U.S. Cl. ........ 430/6; 101/211; 101/426; 283/91; 283/93; 430/10; 430/22; 430/320
[58] Field of Search ........ 283/1 R, 91, 93, 901, 283/902, 904, 81; 101/426, 211; 430/10, 22, 6, 320

[56] References Cited

U.S. PATENT DOCUMENTS

| | | | |
|---|---|---|---|
| 3,640,009 | 2/1972 | Kamiyama et al. | 283/904 |
| 3,675,948 | 7/1972 | Wicker | 283/902 |
| 4,143,967 | 3/1979 | Wicker | 355/77 |
| 4,389,063 | 6/1983 | Ryan | 283/81 |

*Primary Examiner*—Richard L. Schilling
*Attorney, Agent, or Firm*—Cumpston & Shaw

[57] ABSTRACT

A secure and self-verifiable image is formed by an array of image dots 30 on one side of a pellucid stratum or film 10 and a corresponding array of light-transmitting apertures 21 in a dark screen 20 on the other side of film 10, with image dots 30 being offset from the axes of apertures 21 so that the image is viewable only by light passing obliquely through film 10 at an angle that intersects arrayed apertures 21 and dots 30. Both apertures 21 and dots 30 occupy up to about 15% of the total area and the array spacing is at least 40 dots per centimeter. The reflective density of the interaperture regions of dark screen 20 is at least 1.6, and pellucid film 10 is at least 0.05 mm thick.

11 Claims, 13 Drawing Figures

SECURE AND SELF-VERIFIABLE IMAGE

RELATED APPLICATIONS

This application is a divisional application based on my copending application Ser. No. 608,116 filed May 8, 1984, now U.S. Pat. No. 4,632,430, entitled "Secure and Self-Verifiable Image."

BACKGROUND

Images that are secure against copying or counterfeiting and are readily verified as genuine have long been sought. The need is especially dire now when counterfeiting of brand names, credit cards, and valuable documents of many types is increasing.

The many previous suggestions for secure images all fall short of the goal. Most of them fail to foil counterfeiters and prevent copying; and many of them cost too much, either in initial preparation or in verification procedures.

I have discovered a way of securing an image so that it is both self-verifiable and invulnerable to copying and counterfeiting attempts, even with the best of all available and foreseeable technology. My secure image can also be made in large quantities at a low enough cost to serve a multitude of uses. Its production can be secured as readily as any valuable document production, and it can be made with existing equipment and technology.

SUMMARY OF THE INVENTION

I have discovered that an image formed as a dot array can be viewed through a dark screen having a corresponding aperture array; and if the image and dark screen arrays are on opposite sides of a pellucid stratum and offset from each other, the image can be viewed only by light passing obliquely through the stratum.

This prevents any copying of the image by light perpendicular to the plane of the stratum, as is required for photographic and copying processes. Copying the image by light passing obliquely through the stratum is not possible because of varying focal lengths and image foreshortening effects. Any attempt at removing the dark screen from the image mars the image beyond copying. The image can be discernably unique, such as a particilar human countenance, so that a substituted image is conspicuous. My secure image can be printed in large quantities at low cost by using a high level of technical capability and accuracy.

I prefer forming my secure and self-verifiable image with an array of dots spaced at least 40 dots per centimeter and occupying up to about 15% of the total image area. A dark screen combined with the image has an array of light-transmitting apertures at the same spacing as the arrayed dots and also occupying up to about 15% of the total area of the dark screen. The reflective density of the interaperture regions of the dark screen is at least 1.6. A pellucid stratum at least 0.05 mm thick separates the image dots and the dark screen, which are arranged on opposite sides of the stratum. The dots are offset from the axes of the apertures so that the image is viewable only by light passing obliquely through the stratum at an angle that intersects the arrayed apertures and dots.

DRAWINGS

FIG. 1 is a partially schematic, enlarged elevational view of a preferred form of my secure image;

FIGS. 2A–C are enlarged plan views of different offsets for the image and dark screen of FIG. 1;

Figure 6A:
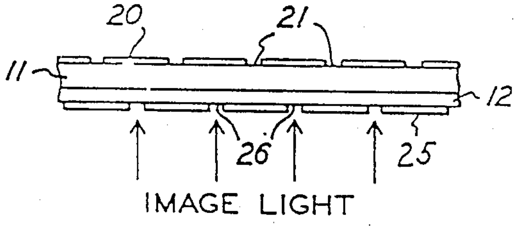
Figure 6B:
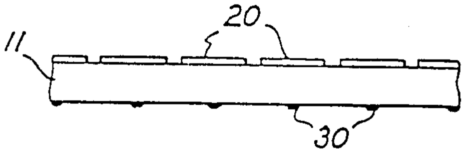

FIGS. 6A and 6B schematically illustrate steps preferred for a method of photographically forming my secure image; and FIGS. 7A–D show the visual effects of viewing variations of my secure image at different angles.

DETAILED DESCRIPTION

An image array of small dots 30 arranged on an image side of pellucid stratum 10 is secured by a dark screen 20 arranged on the opposite, screen side of stratum 10. The spacing and offset of the image dots 30 from light-transmitting apertures 21 in dark screen 20 makes the image indiscernable in light perpendicular to stratum 10 and viewable only by light passing obliquely through stratum 10. Variations in these components can be made effective in several ways.

Image Dot Array

Image dots 30 should not occupy more than about 15% of the total image area. They should also be uniformly spaced, using conventional screen techniques, in an array of at least 40 dots per centimeter. The image can be made sharper and cleaner by limiting the dot sizes to no more than 10% of the total image area and spacing the dots at at least 48 dots per centimeter. The closer the dot spacing, the finer and sharper the image, and the smaller the dots, since they must be restricted to a small percentage of the image area. Dots made photographically can be tiny enough to be spaced at 200 per centimeter; but printing technology, requiring that dots be formed of separated ink spots, cannot practically space dots closer than 60 per centimeter.

Limiting the dot area to 5% or less of the image area is also effective; but the smaller percentage of image area occupied by dots, the closer the dots should be spaced. I prefer dots sized to cover 5 to 10% of the image area and spaced at 48 to 60 dots per centimeter.

Although the image formed by dots 30 can have a single color, I prefer multi-color images for most purposes—partly because colors make the image more discernable and partly to increase the difficulty for counterfeiters. Multi-colored dots, especially when printed at different screen angles for each color, diffuse the viewing light and make the image brighter.

Slight registration inaccuracies, inevitable in multicolor printing of dots 30, do not detract from the security of the image. The effect of slight color misregistration is to tint the image different colors at slightly different viewing angles, but this affords a self-verifying quality. Because of the small size and close spacing of image dots 30, multi-color registration is preferably within the range of exceptionally high quality printing standards.

Each image dot is preferably confined to its predetermined dot area, but does not necessarily fill that area. Varying sizes of image dots within their dot array regions gives the image varying tones from light to dark. Actual ink spot sizes within the dot array regions also vary for different colors in a multi-colored image.

Dark Screen

Apertures 21 of dark screen 20 have the same uniform spacing as image dots 30. Apertures 21 are light transmitting, compared to interaperture regions of dark screen 20 that have a reflective density of at least about 1.6, and preferably at least about 1.8. Circular-shaped, light-transmitting apertures 21 work best; although square, elliptical, and possibly other shapes can be made to work.

Apertures 21 also have the same size as image dots 30 so that apertures 21 occupy up to about 15% of the screen area, and preferably 5 to 10% of the screen area. Precise correspondence between the sizes and spacing of image dots 30 and apertures 21 is best, both for image quality and security.

Figure 4:
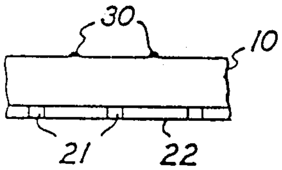
FIGS. 4 and 5 are schematic elevational views of preferred alternative structures for my secure image.
Figure 5:
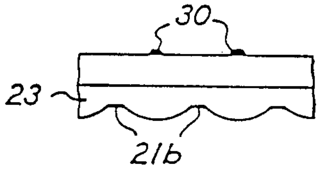

Apertures 21 are preferably formed by lack of ink in spots surrounded by interaperture regions printed with ink to achieve the necessary reflective density. Apertures 21a of FIG. 4 can be punched or laser-formed holes through an otherwise opaque dark screen 22 that is later laminated to pellucid stratum 10. Apertures 21 can also be formed photographically by the presence or absence of light exposing a photographic emulsion, depending on whether positive or negative emulsion is used. Another way of forming light-transmitting apertures is by embossing an array of indentations 21b in a film 23 laminated to stratum 10 as shown in FIG. 5. Combinations of printing and embossing are also possible. Printing dark screen 20 with clear apertures 21 is most economical and thus ordinarily preferred.

Pellucid Stratum

Stratum 10 is pellucid in the sense of being clearly transparent or substantially translucent to visible light. It is normally a clear resin film 10, but it can also be glass or even an air gap. It is normally flat, but can be curved. Stratum 10 is preferably at least 0.05 mm thick and can readily be as thick as a credit card (0.25 mm). Thicker films and strata require larger dots and apertures. Diffuse light is better for viewing the secure image, and film 10 can contribute to this by having a matte finish on its screen surface.

Film or stratum 10 can also be formed as a laminate; and the image, dark screen, or both, can be applied to laminates bonded to film 10. Any laminates that are used should be joined so that any attempt to separate dark screen 20 from the dot image will mar the image beyond repair.

Offset

Figure 1:
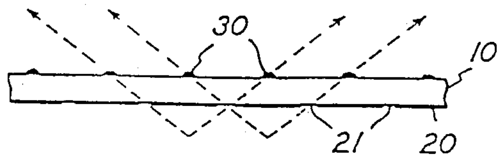
Figure 2A:
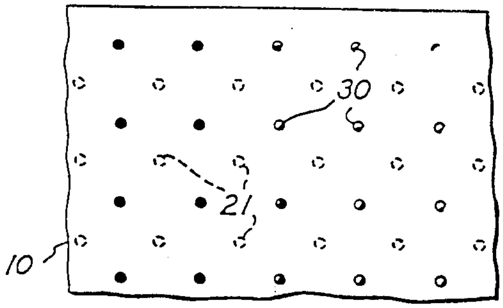
Figure 2B:
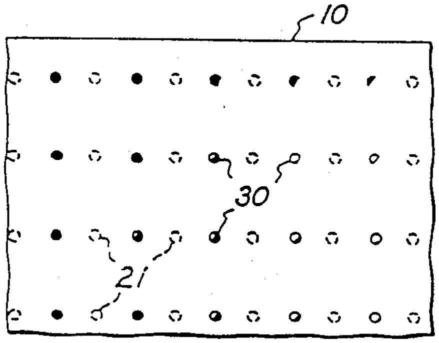
Figure 2C:
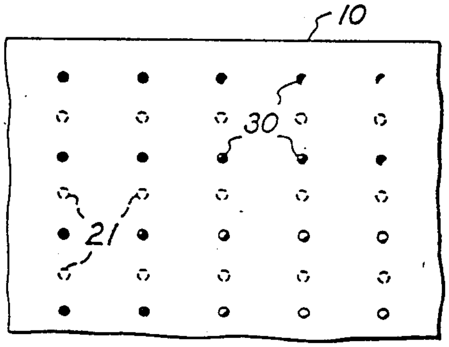

Image dots 30 can be offset in both X and Y directions from the Z axes of apertures 21 for equally spacing dots 30 from all adjacent apertures 21 as shown in FIG. 2A. This hides the image as deeply as possible under the dark screen, but it requires a two-directional tilt as shown in FIG. 7B for verifying the image. Image dots 30 can also be offset horizontally in the X direction only as shown in FIG. 2B to make a secure image readable by a horizontal tilt as shown in FIG. 7D. I prefer, however, a vertical or Y axis offset positioning dots 30 between vertically spaced apertures 21 as shown in FIG. 2C. An image secured this way can be seen by a vertical tilt as shown in FIG. 7C, and people seem to find this easier and more natural.

Figure 3:
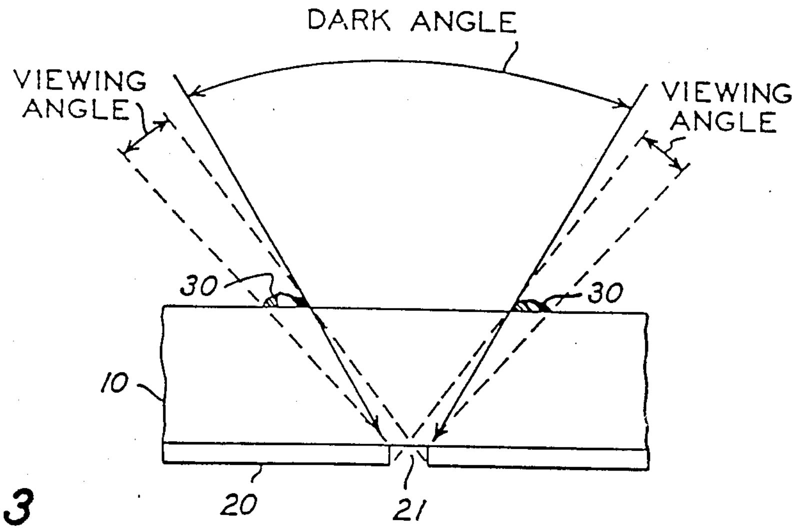
FIG. 3 is an enlarged schematic diagram showing dark angles and viewing angles for the secure image of FIG. 1.

The angular effect of any suitable offset is best shown in FIG. 3. Image dots are viewable only by light passing obliquely through stratum 10 at angles that intersect both the arrayed apertures 21 and the image dots 30. Because of the small size of both dots and apertures, the viewing angles that subtend light intersecting both are limited to a few degrees. The much larger dark angle includes all viewing angles that register dots 30 with the interaperture regions of dark screen 20. The dark angle always includes the perpendicular to the plane of film 10.

Viewing angles are generally not critical, because someone holding the image up to light and tilting it will quickly bracket whatever viewing angle exposes a discernable image. The distance and direction of the offset between image dots and aperture axes and the thickness of the stratum between the image and dark screen both affect the verification angle at which the secure image is visible. Generally, for the convenience of people tilting the image to verify it, a moderate offset requiring a 20° to 30° tilt is adequate and is preferred over an offset requiring a 40° to 45° tilt.

Photographically Forming Image Dots

Besides securing a multitude of printed copies of the same image, my invention can be used for securing individual, photographically formed images as shown schematically in FIGS. 6A and B. The preferred way of doing this is to print dark screen 20 on the back side of a photographic film 11 having an emulsion surface 12 in which image dots 30 are formed photographically. A photographic dark screen 25 having light-transmitting apertures 26 of the same size and uniform spacing as dark screen apertures 21 is laid over emulsion surface 12 so that the only light reaching the emulsion passes through apertures 26. These are offset from apertures 21 on the back side of film 11 so that photographically formed image dots 30 are also offset from dark screen apertures 21.

The image can be a person's picture serving as a photographic identification. With color positive film, the developed image dots 30 form a color representation of the person's countenance, which is secured by dark screen 20 and viewable only by light passing obliquely through film 11.

Uses

Figure 7A:
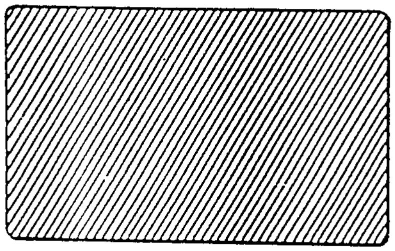
Figure 7B:
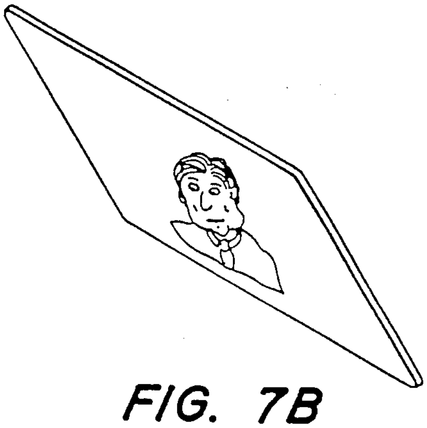
Figure 7C:
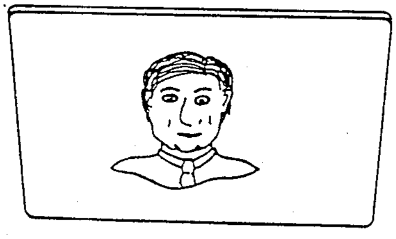
Figure 7D:
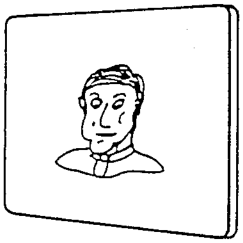

Oblique viewing angles for images secured according to my invention as shown in FIGS. 7B–D contrast with the apparently dark and imageless frontal view of FIG. 7A. The image can be viewed from either side for verification, and a person familiar with tilting the image to verify its genuineness can do this within a second or two.

The image secured can be a photograph of a person or anything else, a symbol or code, protected indicia such as serial numbers or registration numbers, trademark logos or symbols, cryptograms, and many others. Light must pass through the secure image to verify it; but within this limitation, the image can be applied to documents, products, labels, and security devices practically without end. For example, my secure image can be used in a photographic identification, a brand name on a tag or label, a credit card, stock certificate, automobile title, driver's license, tamperproof seal, passport, or other valuable object or document. The dark screen side can bear printed information so long as ink does not block light through apertures 21. Secure images can be mounted in holes in paper documents, and this can be done with punching and fusing equipment. Since quantities of my secure images can be printed at low cost, they are cheap enough to serve as secure labels for a host of genuine products subject to counterfeiting.

I claim:

1. A method of securing a self-verifiable image, said method comprising:

a. forming said image as an array of uniformly spaced dots viewed through a dark screen having an array of apertures with the same uniform spacing as said dots;

b. arranging said dot array and said aperture array to be spaced apart in parallel planes on opposite sides of a pellucid stratum; and c. offsetting the axes of said arrayed dots from the axes of said arrayed apertures and making said dots and apertures sufficiently small relative to the reflective density of said dark screen and the thickness of said pellucid stratum so that said image is not viewable by light passing perpendicularly through said dark screen and said pellucid stratum and is viewable only by light passing obliquely through said pellucid stratum at an angle that intersects said arrayed apertures and said arrayed dots.

2. The method of claim 1 including forming said pellucid stratum of a resin film from 0.05 to 0.25 mm thick.

3. The method of claim 2 including forming said dark screen as a laminate secured to said resin film.

4. The method of claim 1 including forming said dark screen photographically.

5. The method of claim 1 including sizing said dots and said apertures to occupy up to about 15% of the total area of said image.

6. The method of claim 1 including making the uniform spacing of said dots and said apertures at least 40 per centimeter and using a reflective density for interaperture regions of said dark screen of at least about 1.6.

7. The method of claim 1 including forming said dots by printing.

8. The method of claim 1 including forming said dots photographically.

9. The method of claim 1 including forming said dark screen on a screen side of a resin film having a photographic emulsion surface on an image side, overlying said photographic emulsion surface with a photographic dark screen having the same arrayed apertures as said dark screen on said film so as to offset the apertures of said photographic dark screen from the apertures of said dark screen on said film, and imaging said photographic emulsion surface through the overlying photographic dark screen to form said arrayed dots.

10. The method of claim 9 including photographically forming both said dark screen on said resin film and said overlying photographic dark screen.

11. The method of claim 9 including forming said resin film from 0.05 to 0.25 mm thick, and forming said dots and said apertures of said dark screen on said film to occupy up to 10% of the total area of said image.

* * * * *